(12) United States Patent
Schauer

(10) Patent No.: US 7,112,812 B2
(45) Date of Patent: Sep. 26, 2006

(54) OPTICAL MEASUREMENT APPARATUS

(75) Inventor: Ronald Vern Schauer, Gilroy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 427 days.

(21) Appl. No.: 10/033,714

(22) Filed: Dec. 28, 2001

(65) Prior Publication Data

US 2003/0122093 A1 Jul. 3, 2003

(51) Int. Cl.
*G01V 8/00* (2006.01)
*G01N 21/86* (2006.01)

(52) U.S. Cl. ............................. 250/559.29; 250/559.3; 414/935

(58) Field of Classification Search ................ 250/548, 250/559.29, 559.3, 559.33; 414/936, 935, 414/941; 700/218, 225; 901/30, 39, 46, 901/47
See application file for complete search history.

(56) References Cited

U.S. PATENT DOCUMENTS

| | | |
|---|---|---|
| 4,364,086 A | 12/1982 | Guth |
| 4,376,583 A | 3/1983 | Alford et al. |
| 4,713,551 A | 12/1987 | Layman et al. |
| 4,928,002 A | 5/1990 | Corley et al. |
| 5,159,752 A | 11/1992 | Mahant-Shetti et al. |
| 5,239,182 A | 8/1993 | Tateyama et al. |
| 5,291,025 A | 3/1994 | Smith |
| 5,308,993 A | 5/1994 | Holman et al. |
| 5,382,806 A | 1/1995 | Bacchi et al. |
| 5,466,945 A | 11/1995 | Brickell et al. |
| 5,485,759 A | 1/1996 | Goff et al. |
| 5,495,337 A | 2/1996 | Goshorn et al. |
| 5,627,647 A | 5/1997 | Baan et al. |
| 5,798,532 A | 8/1998 | Linehan |
| 5,861,910 A | 1/1999 | McGarry et al. |
| 5,929,766 A | 7/1999 | Rochet et al. |
| 5,943,551 A | 8/1999 | Schemmel et al. |
| 6,011,619 A | 1/2000 | Steffan et al. |
| 6,020,957 A | 2/2000 | Rosengaus et al. |
| 6,038,029 A | 3/2000 | Finarov |
| 6,060,992 A | 5/2000 | Huang et al. |
| 6,094,269 A | 7/2000 | Ben-Dove et al. |

(Continued)

FOREIGN PATENT DOCUMENTS

DE 19514297 10/1996

(Continued)

OTHER PUBLICATIONS

PCT/US02/40503 International Search Report issued Jun. 10, 2003.

*Primary Examiner*—Stephone B. Allen
(74) *Attorney, Agent, or Firm*—Konrad Raynes Victor & Mann, LLP

(57) ABSTRACT

An apparatus, system and method for measuring a feature of a three-dimensional object, such as a wafer carrier, are provided. The apparatus is for use with an optical scanner and comprises a mounting structure adapted to be disposed on the scanner. The mounting structure has a calibration mark adapted to be read by the scanner and is adapted to position the object so that it is at a first pre-determined distance from the calibration mark. In one aspect of the present invention, the mounting structure further comprises an alignment surface adapted to abut the object. The alignment surface is disposed at a second pre-determined distance from the calibration mark. In another aspect of the present invention, the alignment surface is adapted to abut the object at a point spaced apart from the scanning surface.

86 Claims, 7 Drawing Sheets

U.S. PATENT DOCUMENTS

| | | |
|---|---|---|
| 6,132,289 A | 10/2000 | Labunsky et al. |
| 6,160,265 A | 12/2000 | Bacchi et al. |
| 6,165,805 A | 12/2000 | Steffan et al. |
| 6,205,230 B1 | 3/2001 | Sundman et al. |
| 6,252,412 B1 | 6/2001 | Talbot et al. |

FOREIGN PATENT DOCUMENTS

| | | |
|---|---|---|
| EP | 1 158571 | 11/2001 |
| JP | 10 079420 | 3/1998 |
| JP | 10 154744 | 6/1998 |
| JP | 2001 116536 | 4/2001 |

OPTICAL MEASUREMENT APPARATUS

FIELD OF THE INVENTION

This invention relates in general to the field of metrology, and more particularly, to an apparatus, system and method for measuring the features of three dimensional objects, such as for example, items used in semiconductor processing.

BACKGROUND

The need for obtaining highly accurate measurements of three-dimensional objects in a short period of time arises in many industries and fields of endeavor, especially in the manufacturing sectors. One example can be found in the semiconductor processing industry wherein there is a need for accurate measurements of semiconductor wafer carriers.

Wafer carriers include wafer cassettes which can be used for 200 mm semiconductor wafers, and front opening universal pods (FOUPs) which can be used for 300 mm wafers. These wafer carriers hold a number of semiconductor wafers in a substantially rigid housing. Typically these carriers include a plurality of slots into which the wafers are inserted.

Different wafer carrier types may be used depending upon the nature of the processing a wafer is undergoing. For example, during chemical cleaning stages, a wafer carrier constructed of a chemical resistant plastic material is typically used. However such wafer carriers can be subjected to high temperatures as well as physical stresses during the course of wafer processing. As a result, carriers can become warped or deformed after repeated use. For example, such warpage or deformation may cause the carrier slots to vary in alignment which in turn may alter the spacing and alignment of the wafers themselves when placed in the slots. If so, the locations of the wafers inside the carriers can vary outside the tolerance range of automated wafer handling devices, such as wafer handling tools and wafer carrier handling tools, which are used to transfer wafers from one carrier to another or to another location in the manufacturing process, or to transfer wafer carriers to another location.

These automated transfer devices often require the wafers to be seated within the wafer carriers at specified positions within certain tolerances. If the wafers are seated outside these tolerances as a result of carrier distortion or any other reason, then the wafer handling device, which typically operates at high speeds, may mishandle the wafer. Mishandling of the wafers can result in scratches on the wafers or wafer breakage. Moreover, chips or breakage from one wafer can cause damage to other wafers in the carrier thus resulting in substantial financial loss relative to both the value of the wafers themselves as well as production delays.

In order to reduce or eliminate the use of wafer carriers which, for any reason, may fall outside specified tolerances, it is desirable to measure certain features of the carriers, such as warpage, with a high degree of accuracy. While the prior art has provided mechanisms to measure such features, such mechanisms generally are either relatively expensive and slow, on the one hand, or are limited in their measuring abilities, on the other hand.

SUMMARIES OF ILLUSTRATED EMBODIMENTS

In one embodiment, an apparatus for use with a three-dimensional object, such as a wafer carrier, having a feature is provided. The apparatus is for use with an optical scanner having a scanning surface and comprises a mounting structure adapted to be disposed on the scanner. The mounting structure has a calibration mark adapted to be read by the scanner. Further, the mounting structure is adapted to position the object so that it is adjacent to the scanning surface of the scanner and at a first pre-determined distance from the calibration mark. The mounting structure further may be adapted to removably abut the optical scanner.

In one aspect of the present invention, the mounting structure comprises an alignment surface adapted to abut the object. The alignment surface is disposed at a second pre-determined distance from the calibration mark.

In another aspect of the present invention, the alignment surface is adapted to abut the object at a point spaced apart from the scanning surface.

In yet another aspect of the present invention, the alignment surface is generally cylindrical or generally spherical in shape.

In yet another aspect, the mounting structure further comprises a first frame member and a second frame member. The first frame member has a bottom surface and a top surface. The bottom surface is adapted for placement on the scanning surface of the scanner. The top surface is adapted for receiving the object. The second frame member has a proximate end and a distal end. The proximate end is joined with the first frame member. The alignment surface is disposed on the distal end.

In an alternative embodiment, a method of measuring a feature on a side of a wafer carrier is provided. A mounting structure is placed on a scanning surface of an optical scanner. The mounting structure has a calibration mark adapted to being scanned. The wafer carrier is placed on the mounting structure so that the carrier side is adjacent to the scanning surface. The calibration mark and at least a portion of the carrier side is scanned with the optical scanner. A value representing the distance between the calibration mark and the feature on the wafer carrier side is determined.

In yet another embodiment, an optical scanner is operated to obtain an image. The image is comprised of a first image portion representing a first location point on the wafer carrier and a second image portion representing a second location point. A value representing the distance between the first location point and the second location point is calculated from the image.

In one aspect of the present invention, the image is further comprised of a third image portion representing a third location point and a fourth image portion representing a fourth location point. The third and fourth location points represent positions on other than the carrier. A second value representing the distance between the third and fourth location points is calculated. The optical scanner is calibrated with the second value.

In yet another embodiment, data representing an image is received. The image comprises a first image portion representing a first location point on the wafer carrier and a second image portion representing a second location point. A value representing the distance between the first location point and the second location point is calculated from the image.

In another aspect of the present invention, data representing an image of a feature of the carrier is received. A first value corresponding to the carrier feature is calculated from the image. A second value being derived from other than the image is retrieved. The first value is compared with the second value.

There are additional aspects to the present inventions. It should therefore be understood that the preceding is merely a brief summary of some embodiments and aspects of the present inventions. Additional embodiments and aspects of the present inventions are referenced below. It should further be understood that numerous changes to the disclosed embodiments can be made without departing from the spirit or scope of the inventions. The preceding summary therefore is not meant to limit the scope of the inventions. Rather, the scope of the inventions is to be determined by appended claims and their equivalents.

DETAILED DESCRIPTION

In the following description, reference is made to the accompanying drawings which form a part hereof and which illustrate several embodiments of the present invention. It is understood that other embodiments may be used and that structural and operational changes may be made without departing from the scope of the present invention.

The present invention is intended to be used for the measurement of a wide variety of three-dimensional objects which may be found in many industries and businesses. However for illustration, the use of the invention in connection with a wafer cassette as used in the semiconductor manufacturing industry is provided.

Figure 1:
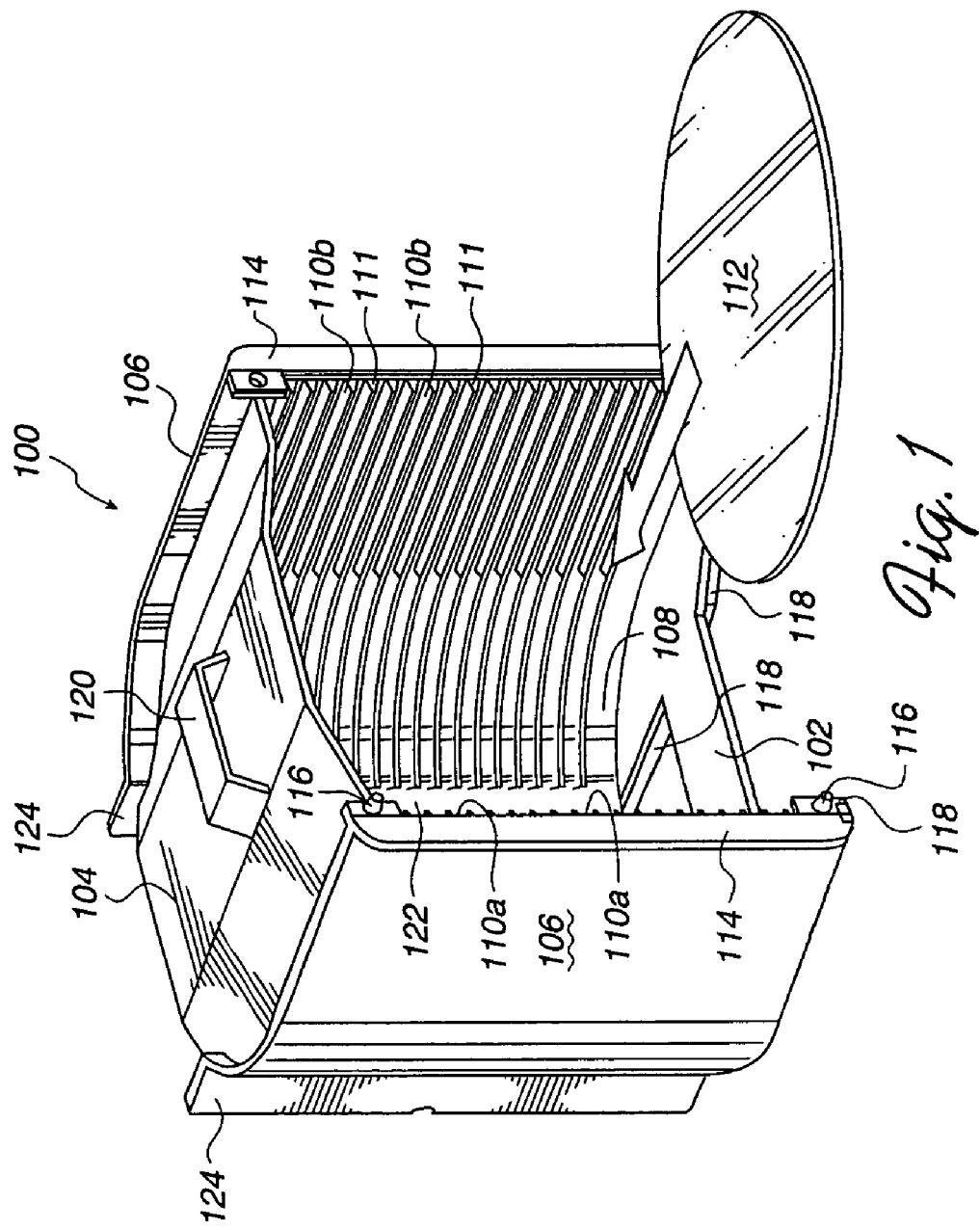
FIG. 1 is a perspective view of a wafer cassette.

Referring to FIG. 1, a standard wafer cassette 100 is shown. The cassette 100 includes a bottom wall 102 which has a generally H-shape and a top wall 104, both of which are connected by two side walls 106. A front opening 108 exposes a plurality of internal grooves or slots 110a, 110b which are defined by a plurality of teeth 111 extending inward from the side walls 106. Each of the slots 110a, 110b is sized to receive a semiconductor wafer 112 which can be inserted via the front opening 108. Extending outwardly from the front opening are two flanges 114, one of which has two alignment pins 116 protruding therefrom. The flanges 114 and alignment pins 116 are adapted for mating with semiconductor handling equipment used in the processing of the wafers.

Extending below the bottom wall 102 is an H-bar 118 which forms the base of the cassette. The H-bar 118 follows the contour of the bottom wall 102 and therefore also is shaped as an "H." The H-bar 118 bears the weight of the cassette 100 as it sits in a horizontal orientation. Extending above the top wall 104 is a handle 120 for convenient manual carrying of the cassette 100. The cassette 100 also has a rear opening 122 from which extends two rear ledges 124. The rear ledges 124 are used to secure the cassette 100 in a pre-determined position during wafer handling operations.

Figure 2A:
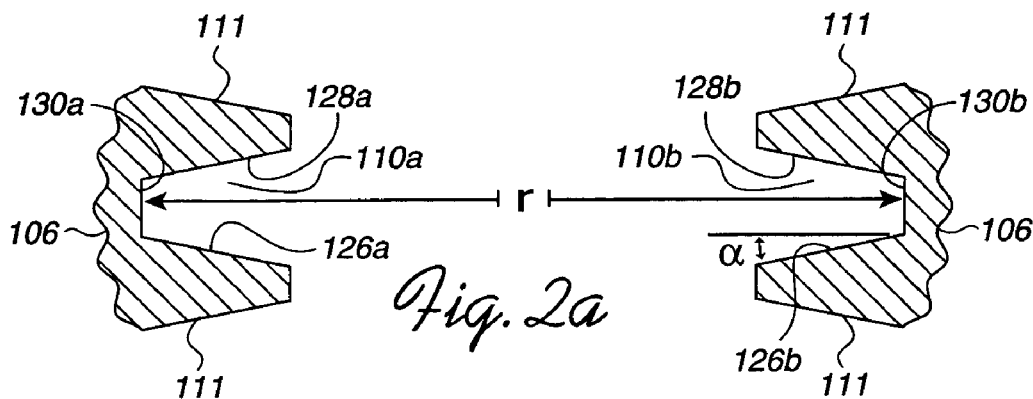
FIGS. 2a, 2b and 2c are cross-sectional side views of cassette slots and teeth, and a semiconductor wafer.

Referring now to FIG. 2a, a side cut-away view of opposing slots 110a, 110b of the cassette is shown. The slots 110a, 110b are formed on the cassette side walls 106 by the plurality of teeth 111 which define opposing slot end walls 130a, 130b, upper slot surfaces 128a, 128b and lower slot surfaces 126a, 126b. The distance between the opposing end walls 130a, 130b is the root, r, of the slots 110a, 110b. The lower surfaces 126a, 126b slope downward from a horizontal plane by an angle, α

Figure 2B:
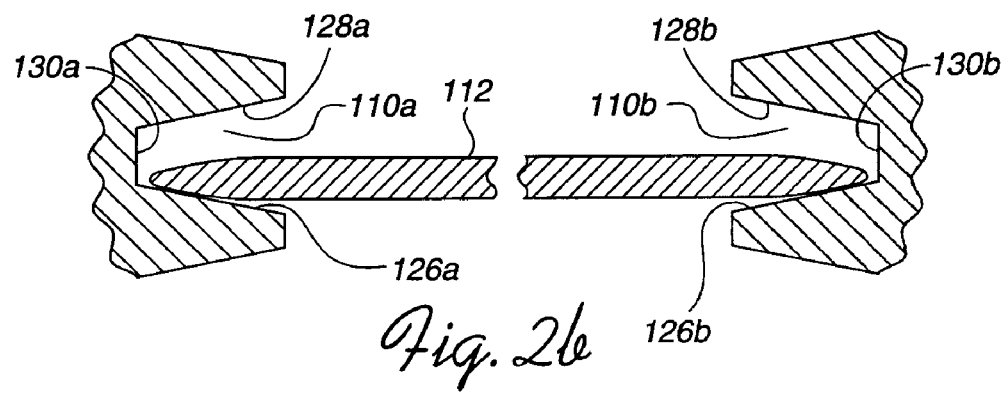
Figure 2C:
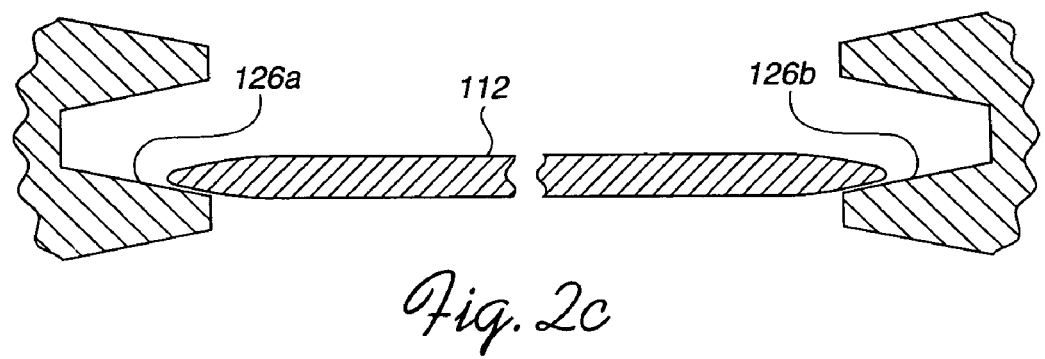

As shown in FIG. 2b, after the wafer 112 is inserted into the cassette, the wafer 112 rests upon the lower surfaces 126a, 126b of the slots 110a, 110b. However should there be warpage of the side walls of the cassette, the opposing slots 110a and 110b may be further apart. The root, r, therefore will be greater in length, and because of the downward slope of the lower surfaces 126a, 126b, the wafer 112 will sit at a lower horizontal position due to the warpage, as best seen in FIG. 2c. These deviations in the horizontal position of the wafer 112 can exceed equipment specifications which can result in wafer damage caused by the automated wafer handling devices. Moreover, wear and tear on the cassettes due to repeated usage in manufacturing processes can result in warpage of the teeth 111 including the upper surfaces 128a, 128b or lower surfaces 126a, 126b of the slots 110a, 110b. Thus should the angle α increase as a result of tooth warpage, the wafer 112 may likewise rest in a horizontal position that is too low for proper automated handling.

Figure 3:
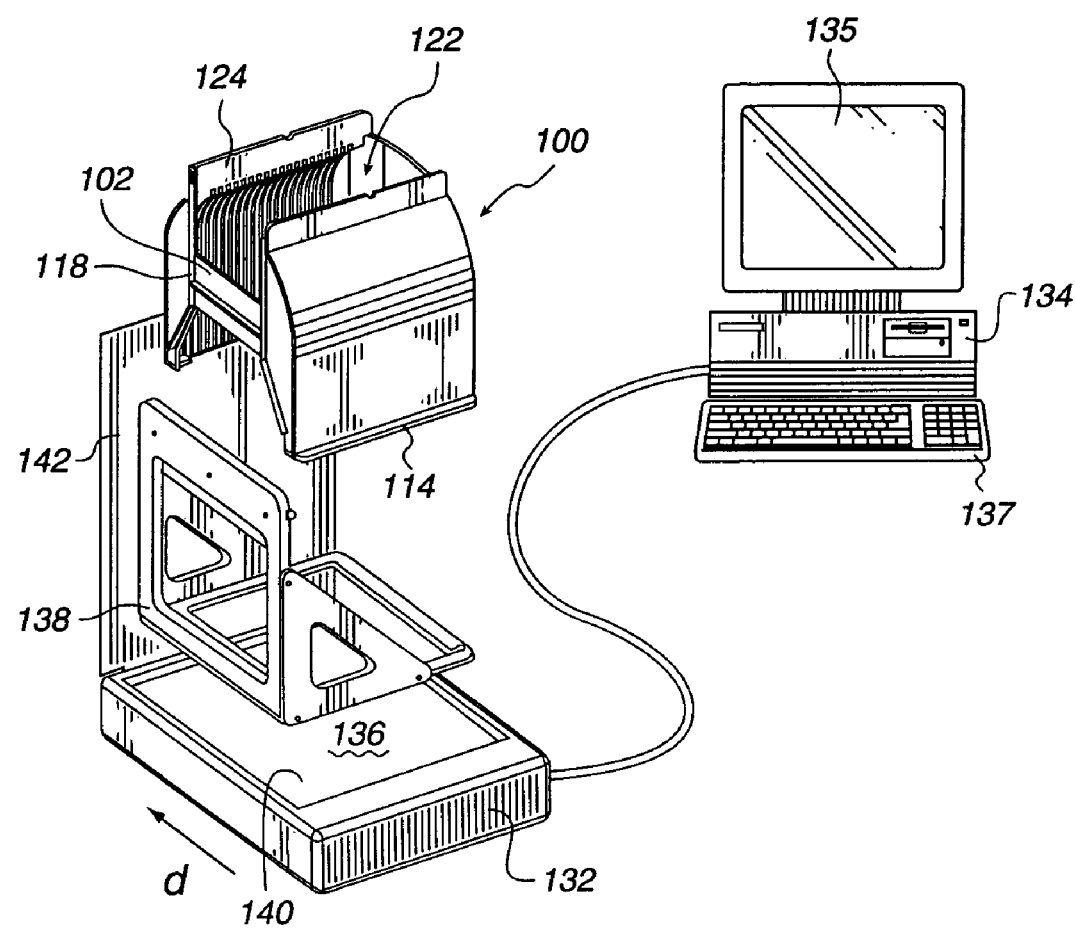
FIG. 3 is an exploded perspective view of an optical measurement apparatus in accordance with one embodiment of the present invention.

Having illustrated in detail an exemplary three dimensional object and the importance in a manufacturing setting of obtaining precise measurement information about the object's features, various embodiments of the invention will be described. Referring to FIG. 3, an exploded perspective view of an optical measurement apparatus in accordance with one embodiment of the present invention is shown. An optical scanner 132 having a scanning surface 136 is in communication with a general purpose computer 134. A mounting structure 138 is removably disposed on the scanner 132. The mounting structure is adapted to receive the three-dimensional object being measured, which in the case of the illustrated embodiment, is the cassette 100. The purpose of the scanner 132 is to obtain an image of a portion of the object being measured, convert the image into digital data and supply this image data to the computer 134.

In the illustrated embodiment, the optical scanner 132 is a conventional flatbed scanner, the construction and operation of which is well known in the art. An example may be the model D1230UF flatbed scanner, manufactured by Canon USA, Inc., Lake Success, New York, U.S.A. In one type of optical scanner, a light source below the scanning surface 136 illuminates the object which has been placed adjacent to the surface 136. This surface 136 typically includes a protective window 140 which often is constructed of transparent glass or plastic. The window 140, in turn, is protected by a hinged lid 142 which may be removed should it interfere with the structure 138 or cassette 100.

Blank, white or light areas reflect more light than do darker features. A motor moves a scan head beneath the scanning surface 136 in a generally linear scanning direction d, and as it moves, the scan head captures light reflected off of individual areas of the object being scanned. The reflected light is again reflected through a system of mirrors which direct the light to a lens. The lens focus the light beams onto scanning elements which translate the quantity of light into an electrical current. These elements can be photo diode elements, CCD's, or any other device which can translate a quantity of light into an electrical current or voltage. Generally, the more light that is reflected, the greater the voltage or the current. An analog-to-digital (ADC) converter stores each analog voltage reading as a digital pixel representing a black or white along a line running orthogonal to the movement direction d of the scan head that can contain hundreds or thousands of pixels per inch. (Some scanners can translate the voltages into shades of gray, or through the use of red, green and blue filters, can create representations of color.) In any event, the digital information is sent to software in the computer 134, where the data is stored in a format with which a graphics program can work.

At least two resolutions may be inherent in optical scanners of this type. A first resolution is a function of the number of pixels per inch running along the line which is orthogonal to the scanning direction of movement d. The more pixels per inch reflects a higher pixel pitch or resolution.

A second resolution is concerned with a second line which runs parallel to the scanning direction of movement d. The scan head is mounted on a transport which is moved across the target object. Although the process may appear to be a continuous movement, the head generally moves only a small fraction of an inch at a time, taking a reading between each movement. In the case of a flatbed scanner, the head is usually driven by a stepper motor, a device which turns a predefined amount each time an electrical pulse is fed. Thus the number of stops per inch determine this y-direction sampling rate which sometimes also is referred to as a scan line pitch or resolution. Different models and designs of optical scanners can result in variations in both types of these resolutions.

Although the illustrated embodiment discloses a conventional flatbed scanner, it should be appreciated that other embodiments may include other optical scanning systems and methods. For example, the optical scanning method or scanner could comprise an X-Y motion table with a fiber optic (or other single point image/reflection) sensor, a CCD line or raster camera, or a digitized traditional video camera.

The computer 134 may be any computer device known in the art, such as a desktop computer, laptop computer, workstation, mainframe, server, personal digital assistant (PDA), etc., which is comprised of a processing unit capable of executing software routines. The computer 134 would include an operating system such as UNIX, OS/2, WINDOWS 95/98/NT/2000/XP, LINUX, Apple, etc. Attached to the computer 134 is a display monitor 135, which may be comprised of any computer display device known in the art. An input device such as a keyboard 137 could also be provided to allow a user to enter data or otherwise operate the computer 134. Other input devices may be comprised of any input means known in the art, including a mouse, touch screen display, voice activated input, electronic pen, etc.

Figure 4:
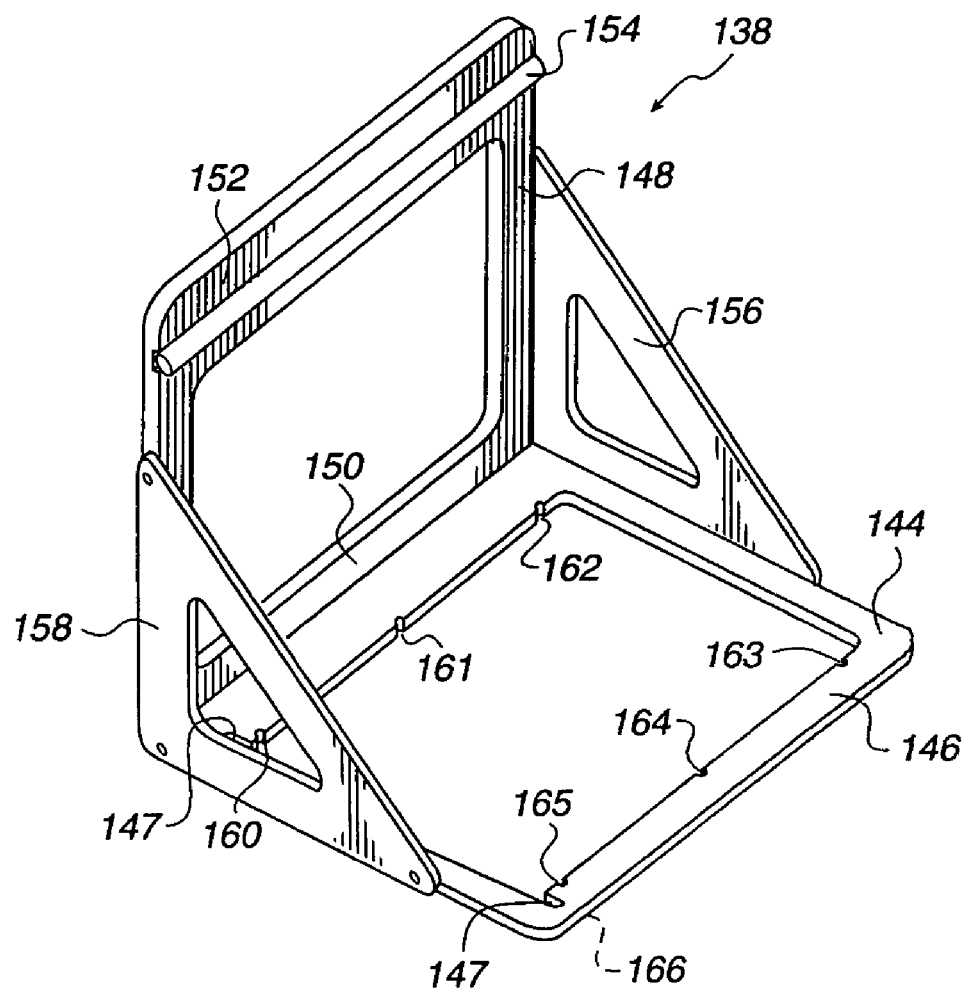
FIG. 4 is a perspective view of a mounting structure of the apparatus of FIG. 3.

FIG. 4 shows a perspective view of the mounting structure 138 in accordance with one embodiment of the present invention. The mounting structure 138 has a first frame member 144 having a bottom surface 166 (FIG. 7) and a top surface 146. The bottom surface 166 is adapted for placement on a scanning surface of a scanner. The top surface 146 is adapted to receive a portion of the three-dimensional object being measured. In this embodiment, slots 147 are formed in the first frame member 144 in order to mate with the alignment pins 116 of the cassette 100 (FIG. 1) to facilitate level seating of the cassette 100 on the structure 138. To further facilitate this level seating, the thickness of the first frame member 144 preferably equals or exceeds the length of the alignment pins 116 so that the pins do not contact the protective window 140 of the scanner 132 (FIG. 3). Alternatively, the protective window 140 could be modified with holes adapted to mate with the alignment pins 116. However, a preferred embodiment reduces or eliminates the need for modifications to the scanner.

Because there is some vertical distance between the scanner surface 136 and the part of the object being measured, it is preferable to use a scanner with CCD scanning elements as opposed to photo diode scanning elements. Some CCD scanning elements can have a depth of field of approximately two inches thus permitting more accurate scanning of object features which are separated from the scanning surface.

A second frame member 148 has a proximate end 150 which is joined with the first frame member 144 and a distal end 152. The first frame member 144 and the second frame member 148 define planes which are orthogonal to one another. The distal end 152 of the second frame member 148 has a generally cylindrically-shaped alignment surface 154 disposed thereon. As will be explained more fully below, this alignment surface 154 is adapted to abut the object being measured at a point which is spaced apart from the scanning surface of the scanner and at a known, predetermined distance from other points on the structure 138. A pair of brace members 156, 158 connect the first and second frame members 144, 148 so that they are rigidly secured to one another.

While the illustrated alignment surface 154 is generally cylindrical in shape, other alignment surfaces may include a spherical shape, or any other shape, such as for example, a square, slit, triangular notch, etc., which preferably permits a precisely-defined contact point with the object so that the object is not constrained in any appreciable manner so that it can assume its true "rest" position for measurement purposes.

The first frame member 144 further includes optical calibration marks comprising a first calibration mark 160, a second calibration mark 161, and a third calibration mark 162 on one side of the first frame member 144, and a fourth calibration mark 163, a fifth calibration mark 164, and a sixth calibration mark 165 on the opposite side of the first frame member 144. In the embodiment of FIG. 4 these optical calibration marks comprise notches extending from the top surface 146 to the bottom surface 166 (FIG. 7) of the first frame member 144. Thus the calibration marks 160–165 are adapted for being read by the scanner 132 when the mounting structure 138 is placed on the scanner 132.

The mounting structure is preferably constructed with precision so that the calibration marks 160–165 are at precisely known, pre-determined distances from the alignment surface 154 and from each other. It should be appreciated that while the calibration marks 160–165 of FIG. 4 are notches, other embodiments can include etchings or markings on the bottom surface 166 of the first frame member 144, holes or other openings extending through the first frame member 144, or any other distinguishing feature which is on any part of the mounting structure 138 and which is adapted to being read by the scanner 132. Although the illustrated embodiment shows six calibration marks, other embodiments may have a greater or lesser number of marks. Moreover while the calibration marks 160–165 of FIG. 4 are located on two opposing sides of the four-sided first frame member 144, other embodiments may include calibration marks on one or both of the other two sides of the frame member.

Figure 5:
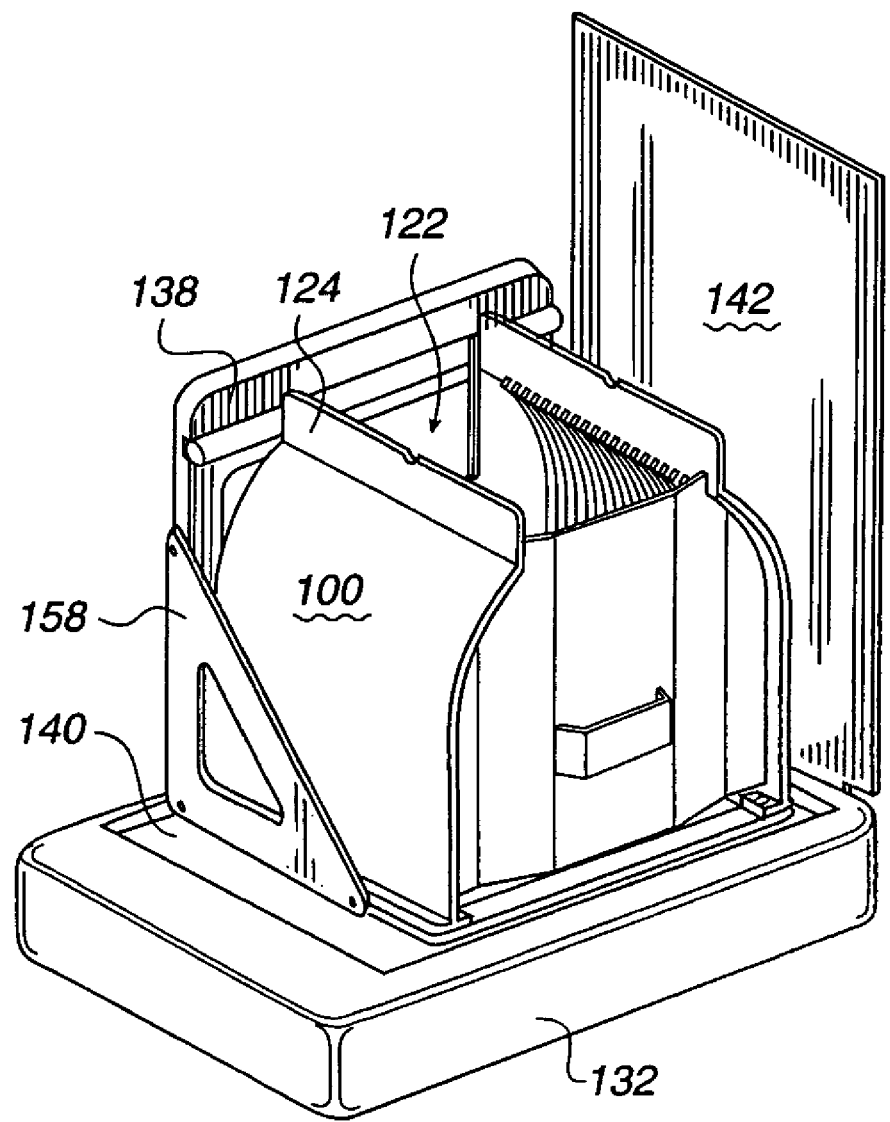
FIG. 5 is a perspective view of a mounting structure and scanner of the apparatus of FIG. 3 shown with a mounted cassette.
Figure 6:
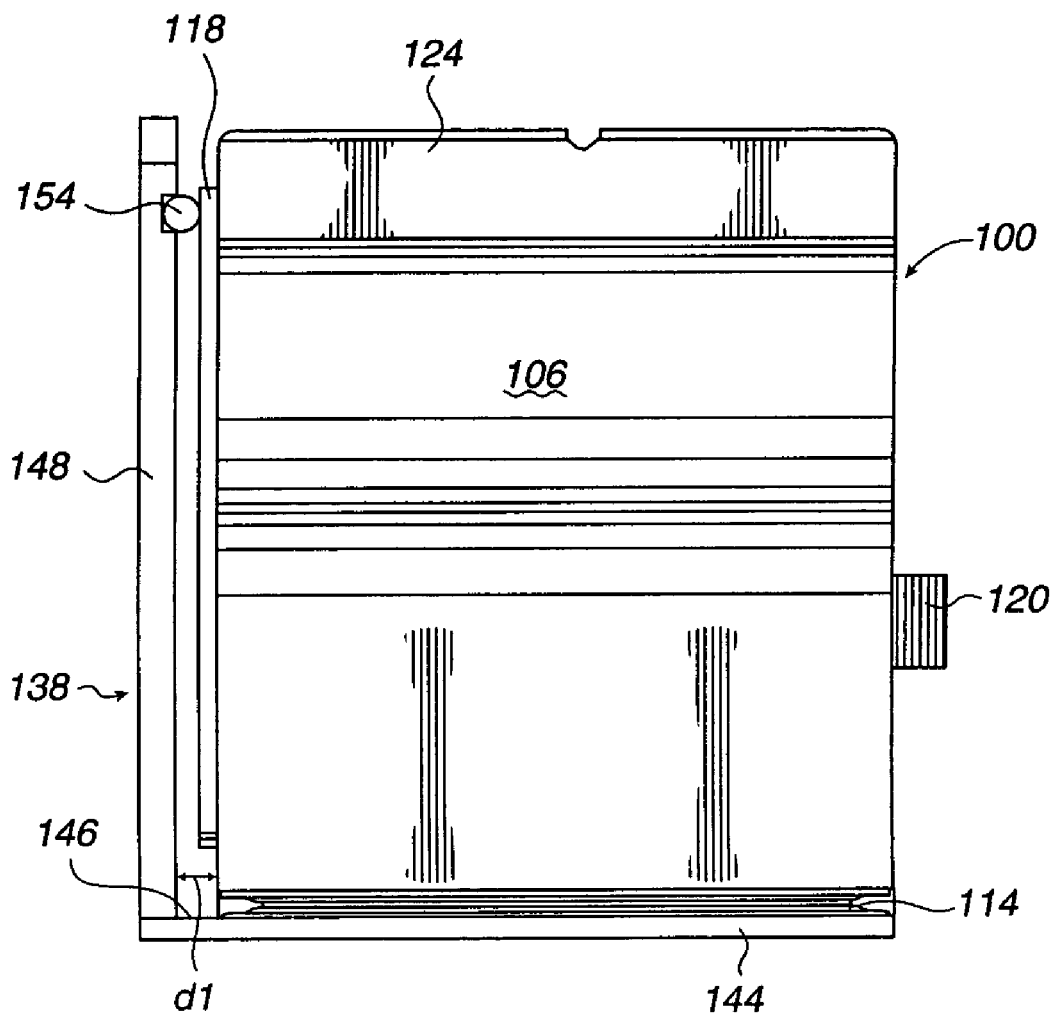
FIG. 6 is a plan side view of the mounting structure of FIG. 3 shown with a mounted cassette.

FIGS. 5 and 6 show the cassette 100 mounted on the mounting structure 138 which in turn is mounted on the scanner 132 in a preferred juxtaposition so that a portion of the cassette 100 can be scanned and measured. (In FIG. 6 the brace member 158 is intentionally omitted from the figure in order to provide an unobstructed side plan view of the cassette 100.) In this embodiment, the front opening 108 (FIG. 1) is the portion of the cassette which is to be scanned and measured, and accordingly, it is the portion which is placed on the top surface 146 of the first frame member 144 which in turn is placed on the protective window 140 of the scanner 132.

The cassette 100 is positioned so that its H-bar 118 abuts the alignment surface 154 of the mounting structure 138 at a point located above the scanning surface thus separating the cassette flange 114 from the second frame member 148 by a distance $d_1$. (FIG. 6) Thus it can be appreciated that should there be warpage of the cassette 100 along an axis extending through its front and rear openings 108, 122, the distance $d_1$ may vary.

As best seen in FIG. 6, because the cylindrically-shaped alignment surface 154 is spaced apart from the scanning surface and because the alignment surface 154 is a known distance from one or more of the calibration marks 160–165 (FIG. 4) which are located on the first frame member 144, the mounting structure 138 employs principles which may be similar to that of a sine bar—a measurement instrument in the field of metrology. Thus referring to FIGS. 6 and 7, as the distance $d_1$ varies, so too will the distance from one or more of the calibration marks 160–165 to any given feature on the cassette, such as the tooth 111.

Figure 7:
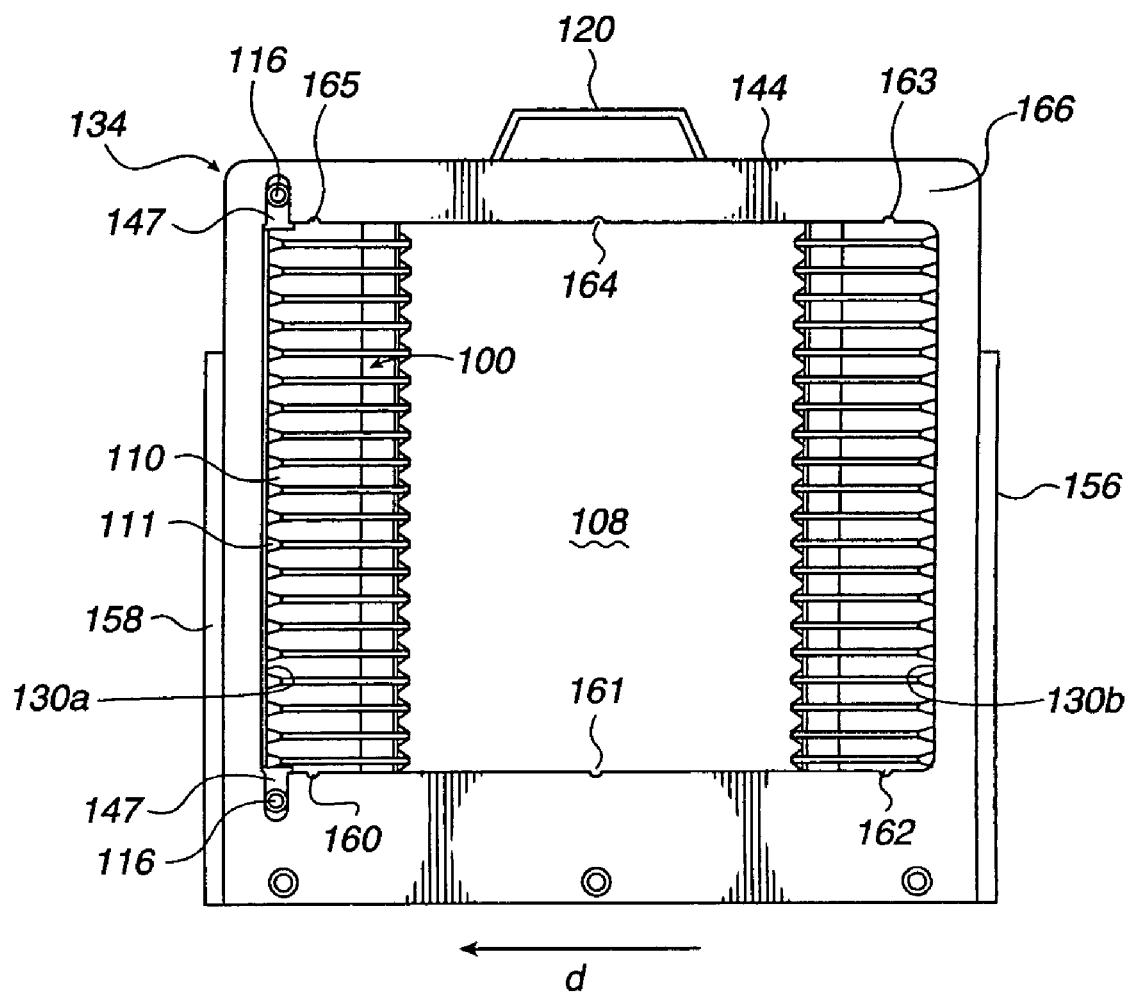
FIG. 7 is a bottom plan view of the mounting structure of FIG. 3 shown with a mounted cassette.

FIG. 7 is a bottom plan view of the front opening 108 of the cassette 100 as it sits upon the mounting structure 134. Thus FIG. 7 illustrates how the cassette 100 and mounting structure 134 appear from the perspective of the movable scan head of the optical scanner (FIG. 5). The scan head moves in the linear direction d, and therefore the first, second and third calibration marks 160–162 define a line which runs in a generally parallel direction to that of the scan head movement. The fourth, fifth and sixth calibration marks 163–165 define a similar line which runs in the same generally parallel direction.

On the other hand, the first and sixth calibration marks 160, 165 define a line running generally orthogonal to the scan head direction d. The same is true for a line defined by the second and fifth calibration marks 161, 164 as well as a line defined by the third and fourth calibration marks 162, 163.

In operation to measure a feature on the side of the wafer cassette 100, the mounting structure 134 is placed on the scanning surface of the optical scanner which is connected to or otherwise in communication with the computer. As best seen in FIGS. 5 and 6, the cassette 100 is placed on the mounting structure 134 so that the cassette flange 114 rests upon the top surface 146 of the first frame member 144 and the cassette H-bar 118 abuts the alignment surface 154. The scanner is operated so that image portions for at least two location points are obtained. For example, one calibration mark as well as at least a portion of the cassette could be scanned. The computer then analyzes this image by performing a numerical best fit of the image portions representing the calibration point and the cassette portion being measured which in turn can be used to determine a value representing the distance between the calibration mark and the feature of the cassette being measured.

It should be appreciated that by using the mounting structure 134 having the calibration marks 160–165 which are separated by known distances from each other and from the alignment surface 154, many features of the cassette 100 can be measured. Because the measurements are achieved with an optical scanner in communication with a computer, these measurements can be stored in a database for comparison against manufacturer specifications, in-house cassette inventory data, etc.

Referring again to FIG. 7, a self-calibration of the scanner can be accomplished by taking measurements between the calibration marks 160–165. The scan head moves in a linear direction d. Therefore by taking a scanned image of the first and second calibration marks 160, 161, for example, and counting the number of scan lines, the scan line pitch or resolution for the particular scanner can be determined. This resolution value may be the scan line count divided by the known, pre-determined distance between these marks as established during construction of the mounting structure 134.

Similarly, the pixel resolution or pitch can be determined by taking a scanned image of the second and fifth calibration marks 161, 164, for example, to determine the number of pixels between these marks and dividing this pixel count by the known, pre-determined distance between these marks as established during the construction of the mounting structure 138.

It should be appreciated that the self-calibration feature of the embodiment of FIG. 7 can be used independently of the model of optical scanner being used. The mounting structure 134 can be used with optical scanners of different makes and designs, each of which can be calibrated in this fashion without the necessity of constructing separate mounting structures for each type of scanner.

Additionally, the mounting structure itself can be scanned and its alignment measured or analyzed to see whether it has been dropped or otherwise damaged. Data corresponding to an image representing a plurality of calibration marks on the mounting structure can be received by the computer. A first geometric shape formed by the calibration marks can be determined and compared with a second, known geometric shape which represents the manufacturer's specification relationship between the calibration marks. For example, the mounting structure 134 of FIG. 7 is constructed so that the first, third, fourth and sixth calibration marks 160, 162, 163, 165 are in a known, geometric relationship with one another—in this case, a rectangular relationship. These four marks can be scanned and their image analyzed to determine whether they are in the rectangular relationship thus indicating that the mounting structure 134 likely is not damaged. On the other hand, if the marks were determined to be in a trapezoidal relationship, for example, rather than the desired rectangular relationship, then this may indicate that the mounting structure 134 is damaged.

As previously mentioned, a plurality of features of the cassette 100 can be determined by scanning one or more locations on the cassette 100, and optionally, one or more calibration marks, as the case may be, and measuring the distances between these locations or marks. Examples of measurable cassette features include: (1) slot pitch, (2) warpage of the cassette along a front-rear axis relative to the cassette base, (3) slot splay and slot tilt (based upon calculation from the previous two features); (4) the distance or offset between the cassette front opening and the base; (5) the distance between the centerline of the lowest slot to the centerline of the of the highest or top slot, (6) bowing of the cassette side walls either inward/outward or left/right; (7) warpage of the cassette in a horizontal plane as viewed from the top of the cassette; (8) side-to-side clearance at the slot root, i.e., the root length; and (9) slot tooth profile.

For example, the root of a particular slot could be measured by scanning the centerline of one slot end wall 130a (FIG. 7) and the centerline of the second, opposing slot end wall 130b and calculating the distance between these points. This value can then be compared against the manufacturer specification data to determine inward or outward warpage of the cassette sides and thus, the acceptability of the cassette for further usage.

A measurement of slot pitch can be made by scanning the centerline of the one slot end wall (preferably the first slot end wall) and the centerline of another slot end wall (preferably the last slot end wall) on the same side of the cassette opening and measuring the distance between them. Dividing this measured distance by the number of slots between the measured bases can yield the slot pitch.

Warpage along a front-rear axis relative to the cassette base may be measured by scanning and calculating a distance between a calibration mark and a cassette component which is susceptible to warpage position changes along a line orthogonal to the scan head direction d. For example, scanning an image of the cassette H-bar 118 at the opening of the cassette (FIG. 1) and of the fifth calibration mark 164 and calculating the distance between these points may yield a value that varies with warpage along the front-rear axis and which, for illustration purposes, is a function of the distance $d_1$, as shown in FIG. 6. (Although the cassette base or H-bar is not shown in FIG. 7, it can be appreciated that the mounting structure 134 can be modified so that the base would be adapted to be read by the scanner in order to scan and measure the foregoing feature.) The measured distance between the H-bar 118 and the fifth calibration mark 164 can then be compared with that of a similar measurement for a cassette known to meet the manufacturer's specification in order to determine whether the test cassette has unacceptable warpage along that axis.

Similarly warpage in a horizontal plane as viewed from the top of the cassette can be determined by scanning and calculating the distance between a calibration mark and a cassette component which is susceptible to warpage position changes along a line parallel to the scan head direction d. For example, an image of the tip of a cassette tooth 111 and the second calibration mark 161 can be scanned and the distance between these points can be calculated. It will be appreciated that if there is warpage in a horizontal plane as viewed from the top of the cassette, this distance will vary. Thus this measured distance can be compared with that of a similar measurement for a cassette known to meet the manufacturer's specification in order to determine whether the test cassette has unacceptable warpage along this plane.

Another feature indicative of cassette warpage or wear is the distance between a point on the scanner base or H-bar located at the front opening of the cassette and the centerline of the end wall of the $1^{st}$ or closest slot tooth. (Although the cassette base is not shown in FIG. 7, it can be appreciated that the mounting structure 134 can be modified so that the cassette base would be adapted to be read by the scanner in order to scan and measure the foregoing feature.) Other features which may vary with cassette wear include slot tooth profiles and slot tooth angles which can be determined by scanning and measuring the distance between a plurality of location points on any given slot tooth.

As to all of the above-described cassette features, it will be appreciated that manufacturer specification data for each of these features can be stored in the computer system. Thus when a portion of a test cassette (and, if necessary, a calibration mark) is scanned, the image data can be received by the computer and a value corresponding to a cassette feature can be calculated. Another value representing the manufacturer specification for that same feature can be retrieved by the computer and compared with the feature as measured on the test cassette. A determination can then be made as to the acceptability of the cassette for further wafer processing usage.

Moreover, each of the foregoing cassette features can be stored in a computer readable medium in a database or other suitable data storage format. Thus data can be accumulated over time, both for the cassette being tested as well as the entire population of cassettes being used by the fabrication facility. To facilitate this data generation, storage and retrieval, a unique identification number can be assigned to each cassette. This identification number can be represented as a bar code which can be attached to or otherwise associated with each cassette. Then the bar code number can be optically scanned either with a hand-held scanner or with the flat bed scanner before, during or after the point in time when the above-described cassette features are being measured. The computer then can receive data corresponding to the bar code number for that cassette, associate the bar code data with the cassette features being measured and store this bar code data.

Alternatively, the cassette identification number can be provided to the computer through reading serial numbers or other non-barcode identifying markings on the cassettes, through electronic means such as identity tags (sensed by contact or wireless means), or even through human manual input by taking the numbers from printed tags or other identity marks.

Alternatively still, all of the cassette's data, i.e., data for the cassette identification number or measured features or both, could be stored in an electronic storage medium which is attached to the cassette itself. In this manner the cassette's data can travel with the cassette as it proceeds through the semiconductor wafer processing facility.

Having developed and stored data for cassette identification numbers and measured features for one or more cassettes, other advantages can then be realized. For example, as a particular cassette is used by an automated wafer handling tool, the cassette's bar code identification can be scanned and the values associated with previously-measured features for that particular cassette can be retrieved from storage. These values can then be provided to the wafer handling tool. For example, certain settings or alignment values for the tool can be adjusted to conform to the unique cassette being used at the time, thus reducing the possibility of wafer damage resulting from tool mis-alignment.

Stored data for cassette features for a population of cassettes can be used for analysis. For example, statistical analysis on this data can be performed to determine information such as failure rate, etc. Moreover, mean, average and median values of particular features for the entire population of cassettes can be calculated for evaluation. These values, which are based upon the total population of cassettes used in a facility, in turn, can be compared against a follow-up set of data representing one or more features of a follow-up cassette. Thus this test cassette can be compared to the total population to determine whether the test cassette falls outside of the specifications for acceptable usage.

The values which are based upon the total population of cassettes in a facility can also be used in connection with the automated wafer handling tools. That is, these values, which represent the mean, average, or some other function of the features of the total population of cassettes, can be provided to the automated tools for use in their calibration or alignment.

While the description above refers to particular embodiments of the present invention, it will be understood that many modifications may be made without departing from the spirit thereof. The claims are intended to cover such modifications as would fall within the true scope and spirit of the present invention. The presently disclosed embodiments are therefore to be considered in all respects as illustrative and not restrictive, the scope of the invention being indicated by the claims rather than the foregoing description, and all changes which come within the meaning and range of equivalency of the claims are therefore intended to be embraced therein.

What is claimed is:

1. An apparatus for use with a three-dimensional object having a feature and an optical scanner having a scanning surface, the apparatus comprising:
a mounting structure adapted to be disposed on the scanner, said mounting structure having a pitch calibration mark adapted for being read by the scanner, said mounting structure further being adapted to position the object so that the object is adjacent to the scanning surface of the scanner and at a first pre-determined distance from the calibration mark.

2. The apparatus of claim 1 wherein the mounting structure is adapted to removably abut the optical scanner.

3. The apparatus of claim 2 wherein the mounting structure comprises an alignment surface adapted to abut the object, the alignment surface being disposed at a second pre-determined distance from the calibration mark.

4. The apparatus of claim 3 wherein the alignment surface is adapted to abut the object at a point spaced apart from the scanning surface.

5. The apparatus of claim 3 further comprising a computer adapted to receive data from the optical scanner.

6. The apparatus of claim 4 wherein the alignment surface is one of generally cylindrical and generally spherical in shape.

7. The apparatus of claim 6 wherein the mounting structure further comprises:
a first frame member having a bottom surface and a top surface, the bottom surface adapted for placement on the scanning surface of the scanner, and the top surface adapted for receiving the object; and
a second frame member having a proximate end and a distal end, the proximate end being joined with the first frame member and the alignment surface being disposed on the distal end.

8. An apparatus for measuring a feature on a side of a wafer carrier, comprising:
an optical scanner having a scanning surface; and
a mounting structure disposed on said scanner and configured to position said wafer carrier over said scanner surface, said structure having a first pitch calibration mark adapted to be read by the scanner and having an alignment surface adapted for engagement with the wafer carrier.

9. The apparatus of claim 8 wherein the mounting structure is adapted to removably abut the optical scanner.

10. The apparatus of claim 8 wherein the wafer carrier side has an alignment pin having a length and wherein the mounting structure is further adapted to position the wafer carrier so that the carrier side is in a generally parallel, spaced-apart relationship with the scanning surface of the scanner by a distance that is greater than the length of the alignment pin.

11. The apparatus of claim 8 wherein the optical scanner has a scan head adapted to move in a scanning direction, the apparatus further comprising:
a second pitch calibration mark located on the mounting structure and adapted for being read by the scanner, the second calibration mark located at a first pre-determined distance from the first calibration mark, the second calibration mark and the first calibration mark defining a line running generally orthogonal to the scanning direction.

12. The apparatus of claim 8 further comprising a computer adapted to receive data from the optical scanner.

13. The apparatus of claim 8 wherein the optical scanner has a scan head adapted to move in a scanning direction, the apparatus further comprising:
a second pitch calibration mark located on the mounting structure and adapted for being read by the scanner, the second calibration mark located at a first pre-determined distance from the first calibration mark, the second calibration mark and the first calibration mark defining a line running generally parallel to the scanning direction.

14. The apparatus of claim 13 further comprising:
a third pitch calibration mark and a fourth pitch calibration mark, said third and fourth calibration marks located on the mounting structure and adapted for being read by the scanner, the third and fourth calibration marks located at a second pre-determined distance from one another and defining a line running generally orthogonal to the scanning direction.

15. The apparatus of claim 14 wherein the alignment surface is adapted to abut the wafer carrier, the alignment surface being disposed at a third pre-determined distance from one of the first, second, third and fourth calibration marks.

16. The apparatus of claim 8 wherein the alignment surface is adapted to abut the wafer carrier at a point spaced apart from the scanning surface, the alignment surface being disposed at a first pre-determined distance from the first calibration mark.

17. The apparatus of claim 16 wherein the alignment surface is one of generally cylindrical and generally spherical in shape.

18. An apparatus for measuring a feature on a side of a wafer carrier comprising:
a mounting structure having an alignment surface adapted for engagement with said carrier, said structure further having a first optical pitch calibration mark.

19. The apparatus of claim 18 having a second optical pitch calibration mark positioned a first pre-determined distance along a first direction from said first calibration mark.

20. The apparatus of claim 19 wherein said structure has a third optical pitch calibration mark and a fourth optical pitch calibration mark positioned at a second pre-determined distance from said third optical calibration mark in a second direction generally orthogonal to the first direction.

21. An apparatus for measuring a feature on a side of a wafer carrier comprising:
an optical scanner having a scanning surface;
a first frame member having a bottom surface and a top surface, the bottom surface being adapted for placement on the scanning surface of the scanner, and the top surface being adapted for receiving the wafer carrier side;
a second frame member having a proximate end and a distal end, the proximate end being joined with the first frame member;
a generally cylindrically-shaped alignment surface disposed at the distal end of the second frame member and adapted to abut the wafer carrier;

a brace member secured to the first and the second frame members; and a first calibration mark on the bottom surface of the first frame member and adapted to being read by the scanner, the first calibration mark positioned at a first pre-determined distance from the alignment surface.

22. The apparatus of claim 21 further comprising a second calibration mark on the bottom surface of the first frame member and adapted to being read by the scanner, the second calibration mark positioned at a second pre-determined distance from the first calibration mark.

23. The apparatus of claim 21 wherein the alignment surface is adapted to abut the wafer carrier at a point spaced apart from the scanning surface.

24. A method of measuring a feature of a wafer carrier comprising:
   operating an optical scanner to obtain an image comprising:
      a first image portion representing a first location point on the wafer carrier; and
      a second image portion representing a second location point; and
   calculating a first value from the image, the first value representing the distance between the first location point and the second location point;
   wherein the image further comprises a third image portion representing a third location point and a fourth image portion representing a fourth location point, and wherein the third and fourth location points represent positions on other than the wafer carrier, the method further comprising:
      calculating a second value from the image, the second value representing the distance between the third and fourth location points; and
      calibrating the optical scanner with the second value.

25. The method of claim 24 wherein the step of calibrating the optical scanner comprises measuring the pixel resolution of the scanner.

26. The method of claim 24 wherein the step of calibrating the optical scanner comprises measuring the scan line resolution of the scanner.

27. The method of claim 24 wherein the step of calculating the first value is comprised of performing a numerical best fit of the image of the first and second location points.

28. An apparatus for measuring a feature on a side of a wafer carrier comprising:
   means for obtaining an image;
   means for positioning the wafer carrier so that the carrier side is adjacent to the image obtaining means; and
   a pitch calibration mark on the positioning means and adapted to being read by the image obtaining means.

29. The apparatus of claim 28 further comprising means for positioning the wafer carrier at a pre-determined distance from the calibration mark.

30. The apparatus of claim 29 further comprising a plurality of additional pitch calibration marks on the positioning means and adapted to being read by the image obtaining means, the additional calibration marks being at a plurality of additional pre-determined distances from one another.

31. An apparatus for measuring a feature of a wafer carrier, the apparatus comprising:
   means for obtaining an image comprising:
      a first image portion representing a first location point on the wafer carrier; and
      a second image portion representing a second location point; and
   means for calculating a first value from the image, the first value representing the distance between the first location point and the second location point;
   wherein the image further comprises a third image portion representing a third location point and a fourth image portion representing a fourth location point, and wherein the third and fourth location points represent positions on other than the wafer carrier, the apparatus further comprising:
   means for calculating a second value from the image, the second value representing the distance between the third and fourth location points; and
   means for calibrating the image obtaining means using the second value.

32. The apparatus of claim 31 wherein the second location point represents a location on other than the wafer carrier.

33. A method of measuring a feature of a wafer carrier, comprising:
   receiving data representing an image comprising:
      a first image portion representing a first location point on the wafer carrier; and
      a second image portion representing a second location point; and
   calculating a value from the image, the value representing the distance between the first location point and the second location point.

34. The method of claim 33 wherein the first location point is a base of a front opening of the wafer carrier and the second location point is a location other than on the wafer carrier.

35. The method of claim 33 wherein the first location point is a center line of a first slot end wall and the second location point is the center line of a second slot end wall.

36. The method of claim 33 wherein the first location point is an end wall of one slot tooth measured at one side of an opening of the wafer carrier and the second location point is an end wall of a corresponding opposed slot tooth measured at the other side of the wafer carrier opening, and wherein the value is a slot root.

37. The method of claim 33 wherein the first location point is a first point on a slot tooth and the second location point is a second point on the slot tooth, and wherein the wafer carrier feature is a profile of the slot tooth.

38. The method of claim 33 wherein the first location point is a first point on a slot tooth and the second location point is a second point on the slot tooth, and wherein the wafer carrier feature is a slant angle of the slot tooth.

39. The method of claim 33 wherein the first location point is a base of a front opening of the wafer carrier and the second location point is a centerline of a slot tooth end wall.

40. A method of analyzing a wafer carrier comprising:
   receiving data representing an image of a feature of the wafer carrier;
   calculating a first value from the image, the first value corresponding to the wafer carrier feature;
   retrieving a second value, the second value being derived from other than the image; and
   comparing the first value with the second value.

41. A method of analyzing at least one wafer carrier comprising:
   receiving a first set of data representing a first image of a feature of a first wafer carrier;
   receiving a set of data representing an image of a span between two pitch calibration marks spaced by a pre-determined distance and located on a frame adjacent said carrier;

calculating a pixel pitch based on said predetermined distance and the number of pixels of said image of said span between said pitch calibration marks;

calculating a first value from the first set of data and based on the calculated pixel pitch, the first value corresponding to the first wafer carrier feature; and storing the first value in a computer readable medium.

42. The method of claim 41 further comprising:

retrieving the first value from the computer readable medium; and providing the first value for use by one of a wafer handling tool and a wafer carrier handling tool.

43. The method of claim 41 further comprising:

receiving additional data corresponding to an identification number for the first wafer carrier;

storing the additional data in the computer readable medium; and associating the additional data with the first value.

44. The method of claim 43 wherein the additional data is derived from a bar code.

45. The method of claim 41 further comprising:

receiving a second set of data representing a second image of the feature of a second wafer carrier;

calculating a second value from the second set of data, the second value corresponding to the feature of the second wafer carrier; and storing the second value in the computer readable medium.

46. The method of claim 45 further comprising:

retrieving the first and second values from the computer readable medium; and performing statistical analysis using the first and second values.

47. The method of claim 45 further comprising:

receiving a plurality of sets of additional data representing a plurality of additional images of features of a plurality of additional wafer carriers;

calculating a plurality of additional values from the plurality of additional sets of data, the plurality of additional values corresponding to the plurality of features of the additional wafer carriers;

storing the plurality of additional values in the computer readable medium; and calculating a final value as a function of the first value, the second value and the plurality of additional values.

48. The method of claim 47 wherein the final value corresponds to one of a mean value, an average value and a median value.

49. The method of claim 47 further comprising:

receiving a follow-up set of data representing a follow-up image of the feature of a follow-up wafer carrier;

calculating a follow-up value from the follow-up set of data, the follow-up value corresponding to the follow-up wafer carrier feature; and comparing the follow-up value with the final value.

50. The method of claim 47 further comprising:

providing the final value for use by one of a wafer handling tool and a wafer carrier handling tool.

51. A method of measuring a mounting structure comprising:

receiving data corresponding to an image representing a plurality of calibration marks on the mounting structure;

determining a first geometric shape formed by the calibration marks; and comparing the first geometric shape with a second geometric shape.

52. A system for analyzing a wafer carrier, comprising:

a processing unit capable of executing software routines;

a frame adapted to be placed adjacent said carrier and having at least two pitch calibration marks spaced by a predetermined distance; and program logic executed by the processing unit and adapted to:

receive data representing an image comprising:

a first image portion representing a first location point on the wafer carrier; and a second image portion representing a second location point;

receive a set of data representing an image of the span between said two pitch calibration marks;

calculate a pixel pitch based on said predetermined distance and the number of pixels of said image of said span between said pitch calibration marks; and calculate a value from the first image and based on the calculated pixel pitch, the value representing the distance between the first location point and the second location point.

53. The system of claim 52 wherein the first location point is a base of a front opening of the wafer carrier and the second location point is a location other than on the wafer carrier.

54. The system of claim 52 wherein the first location point is a center line of a first slot end wall and the second location point is the center line of a second slot end wall.

55. The system of claim 52 wherein the first location point is an end wall of one slot tooth measured at one side of an opening of the wafer carrier and the second location point is an end wall of a corresponding opposed slot tooth measured at the other side of the wafer carrier opening, and wherein the value is a slot root.

56. The system of claim 52 wherein the first location point is a first point on a slot tooth and the second location point is a second point on the slot tooth, and wherein the wafer carrier feature is a profile of the slot tooth.

57. The system of claim 52 wherein the first location point is a first point on a slot tooth and the second location point is a second point on the slot tooth, and wherein the wafer carrier feature is a slant angle of the slot tooth.

58. The system of claim 52 wherein the first location point is a base of a front opening of the wafer carrier and the second location point is a centerline of a slot tooth end wall.

59. A system for analyzing a wafer carrier, comprising:

a frame adapted to be placed adjacent said carrier and having at least two pitch calibration marks spaced by a predetermined distance;

a processing unit capable of executing software routines; and program logic executed by the processing unit, comprising:

means for receiving data representing an image of a feature of the wafer carrier, and a set of data representing an image of the span between said two pitch calibration marks;

means for calculating a pixel pitch based on said predetermined distance and the number of pixels of said image of said span between said pitch calibration marks, and a first value from the image based on the calculated pixel pitch, the first value corresponding to the wafer carrier feature;

means for retrieving a second value, the second value being derived from other than the image; and means for comparing the first value with the second value.

60. A system for analyzing a wafer carrier, comprising:
a processing unit capable of executing software routines; and
program logic executed by the processing unit, comprising:
means for receiving a first set of data representing a first image of a feature of a first wafer carrier;
means for calculating a first value from the first set of data, the first value corresponding to the first wafer carrier feature;
means for storing the first value in a computer readable mediums;
means for retrieving the first value from the computer readable medium; and
means for providing the first value for use by one of a wafer handling tool and a wafer carrier handling tool.

61. The system of claim 60 further comprising:
means for receiving additional data corresponding to an identification number for the first wafer carrier;
means for storing the additional data in the computer readable medium; and
means for associating the additional data with the first value.

62. The system of claim 61 wherein the additional data is derived from a bar code.

63. The system of claim 60 further comprising:
means for receiving a second set of data representing a second image of the feature of a second wafer carrier;
means for calculating a second value from the second set of data, the second value corresponding to the feature of the second wafer carrier; and
means for storing the second value in the computer readable medium.

64. The system of claim 63 further comprising:
means for retrieving the second value from the computer readable medium; and
means for performing statistical analysis using the first and second values.

65. The system of claim 63 further comprising:
means for receiving a plurality of sets of additional data representing a plurality of additional images of features of a plurality of additional wafer carriers;
means for calculating a plurality of additional values from the plurality of additional sets of data, the plurality of additional values corresponding to the plurality of features of the additional wafer carriers;
means for storing the plurality of additional values in the computer readable medium; and
means for calculating a final value as a function of the first value, the second value and the plurality of additional values.

66. The system of claim 65 wherein the final value corresponds to one of a mean value, an average value and a median value.

67. The system of claim 65 further comprising:
means for receiving a follow-up set of data representing a follow-up image of the feature of a follow-up wafer carrier;
means for calculating a follow-up value from the follow-up set of data, the follow-up value corresponding to the follow-up wafer carrier feature; and
means for comparing the follow-up value with the final value.

68. The system of claim 65 further comprising:
means for providing the final value for use by one of a wafer handling tool and a wafer carrier handling tool.

69. A system for measuring a mounting structure, comprising:
a processing unit capable of executing software routines; and
program logic executed by the processing unit, and adapted to:
receive data corresponding to an image representing a plurality of calibration marks on the mounting structure;
determine a first geometric shape formed by the calibration marks; and
compare the first geometric shape with a second geometric shape.

70. An article of manufacture for use in analyzing a wafer carrier, the article of manufacture comprising a computer usable media including at least one computer program embedded therein that causes the computer to perform:
receiving data representing an image comprising:
a first image portion representing a first location point on the wafer carrier; and
a second image portion representing a second location point; and
calculating a value from the image, the value representing the distance between the first location point and the second location point.

71. The article of manufacture of claim 70 wherein the first location point is a base of a front opening of the wafer carrier and the second location point is a location other than on the wafer carrier.

72. The article of manufacture of claim 70 wherein the first location point is a center line of a first slot end wall and the second location point is the center line of a second slot end wall.

73. The article of manufacture of claim 70 wherein the first location point is an end wall of one slot tooth measured at one side of an opening of the wafer carrier and the second location point is an end wall of a corresponding opposed slot tooth measured at the other side of the wafer carrier opening, and wherein the value is a slot root.

74. The article of manufacture of claim 70 wherein the first location point is a first point on a slot tooth and the second location point is a second point on the slot tooth, and wherein the wafer carrier feature is a profile of the slot tooth.

75. The article of manufacture of claim 70 wherein the first location point is a first point on a slot tooth and the second location point is a second point on the slot tooth, and wherein the wafer carrier feature is a slant angle of the slot tooth.

76. The article of manufacture of claim 70 wherein the first location point is a base of a front opening of the wafer carrier and the second location point is a centerline of a slot tooth end wall.

77. An article of manufacture for use in analyzing at least one wafer carrier, the article of manufacture comprising a computer usable media including at least one computer program embedded therein that causes the computer to perform:
receiving a first set of data representing a first image of a feature of a first wafer carrier;
calculating a first value from the first set of data, the first value corresponding to the first wafer carrier feature;
storing the first value in a computer readable medium;
retrieving the first value from the computer readable medium; and providing the first value for use by one of a wafer handling tool and a wafer carrier handling tool.

78. The article of manufacture of claim 77 further comprising:
receiving additional data corresponding to an identification number for the first wafer carrier;
storing the additional data in the computer readable medium; and
associating the additional data with the first value.

79. The article of manufacture of claim 78 wherein the additional data is derived from a bar code.

80. The article of manufacture of claim 77 further comprising:
receiving a second set of data representing a second image of the feature of a second wafer carrier;
calculating a second value from the second set of data, the second value corresponding to the feature of the second wafer carrier; and
storing the second value in the computer readable medium.

81. The article of manufacture of claim 80 further comprising:
retrieving the second value from the computer readable medium; and
performing statistical analysis using the first and second values.

82. The article of manufacture of claim 80 further comprising:
receiving a plurality of sets of additional data representing a plurality of additional images of features of a plurality of additional wafer carriers;
calculating a plurality of additional values from the plurality of additional sets of data, the plurality of additional values corresponding to the plurality of features of the additional wafer carriers;
storing the plurality of additional values in the computer readable medium; and
calculating a final value as a function of the first value, the second value and the plurality of additional values.

83. The article of manufacture of claim 82 wherein the final value corresponds to one of a mean value, an average value and a median value.

84. The article of manufacture of claim 82 further comprising:
receiving a follow-up set of data representing a follow-up image of the feature of a follow-up wafer carrier;
calculating a follow-up value from the follow-up set of data, the follow-up value corresponding to the follow-up wafer carrier feature; and
comparing the follow-up value with the final value.

85. The article of manufacture of claim 82 further comprising:
providing the final value for use by one of a wafer handling tool and a wafer carrier handling tool.

86. An article of manufacture for use in measuring a mounting structure, the article of manufacture comprising a computer usable media including at least one computer program embedded therein that causes the computer to perform:
receiving data corresponding to an image representing a plurality of calibration marks on the mounting structure;
determining a first geometric shape formed by the calibration marks; and
comparing the first geometric shape with a second geometric shape.

\* \* \* \* \*